United States Patent
Bogen et al.

(10) Patent No.: US 9,111,900 B2
(45) Date of Patent: Aug. 18, 2015

(54) POWER SEMICONDUCTOR DEVICE AND METHOD FOR PRODUCING A POWER SEMICONDUCTOR DEVICE

(71) Applicant: Semikron Elektronik GmbH & Co., KG, Nürnberg (DE)

(72) Inventors: Ingo Bogen, Nürnberg (DE); Markus Beck, Neumarkt (DE); Hartmut Kulas, Ebermannstadt (DE); Alexander Popescu, Fürth (DE); Reinhard Helldörfer, Baiersdorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/476,299

(22) Filed: Sep. 3, 2014

(65) Prior Publication Data

US 2015/0061112 A1   Mar. 5, 2015

(30) Foreign Application Priority Data

Sep. 3, 2013   (DE) .................. 10 2013 109 589

(51) Int. Cl.
| | |
|---|---|
| H01L 23/34 | (2006.01) |
| H01L 23/367 | (2006.01) |
| H05K 7/20 | (2006.01) |
| H01L 21/48 | (2006.01) |
| H01L 23/00 | (2006.01) |

(52) U.S. Cl.
CPC ........ *H01L 23/3675* (2013.01); *H01L 21/4882* (2013.01); *H01L 23/3672* (2013.01); *H01L 23/3677* (2013.01); *H01L 24/83* (2013.01); *H05K 7/20927* (2013.01); *H01L 2224/83237* (2013.01); *H01L 2224/83238* (2013.01); *H01L 2224/83801* (2013.01); *H01L 2924/13091* (2013.01); *H01L 2924/20103* (2013.01); *H01L 2924/20104* (2013.01)

(58) Field of Classification Search
CPC ............... H01L 21/4882; H01L 2023/4056; H01L 23/367; H01L 23/473; H01L 2224/97; H01L 2224/32245
USPC ............... 257/706, 707, 712, 713, 714, 722; 438/121, 122
See application file for complete search history.

(56) References Cited

U.S. PATENT DOCUMENTS

| | | | | |
|---|---|---|---|---|
| 5,323,292 | A  * | 6/1994 | Brzezinski ................. | 361/689 |
| 5,514,906 | A  * | 5/1996 | Love et al. ................. | 257/712 |
| 7,071,552 | B2 * | 7/2006 | Ravi et al. ................. | 257/712 |
| 8,369,090 | B2 * | 2/2013 | Chester et al. ............. | 361/699 |
| 8,730,672 | B2 | 5/2014 | Ebersberger et al. | |

* cited by examiner

*Primary Examiner* — S. V. Clark
(74) *Attorney, Agent, or Firm* — The Law Offivces of Roger S. Thompson

(57) ABSTRACT

A power semiconductor device comprising a power semiconductor module and a heat sink and a method for its manufacture. The heat sink has a first cooling housing component, with a cutout passing therethrough, and a second cooling housing component, with a cooling plate arranged in the cutout. The first and second cooling housing components are configured and arranged relative to one another so that a cavity is formed at the side of the cooling plate facing away from the power semiconductor components. The cooling plate is connected to the first cooling housing component by a first weld seam which extends circumferentially therearound. The first weld seam seals the cooling plate in relation to the first cooling housing component, and the second cooling housing component is connected to the first cooling housing component. The inventive power semiconductor device has good heat conduction from the power semiconductor components to a heat sink.

15 Claims, 9 Drawing Sheets

POWER SEMICONDUCTOR DEVICE AND METHOD FOR PRODUCING A POWER SEMICONDUCTOR DEVICE

BACKGROUND OF THE INVENTION

1. Field of the Invention

The invention relates to a power semiconductor device, and to a method for producing a power semiconductor device.

2. Description of the Related Art

Known power semiconductor devices generally include power semiconductor components, such as, e.g., power semiconductor switches and diodes, which are arranged on a substrate and are electrically conductively connected to one another by a conductor layer of the substrate, and bonding wires and/or a film composite. In such known devices, the power semiconductor switches are generally present in the form of transistors, such as, e.g., IGBTs (Insulated Gate Bipolar Transistors) or MOSFETs (Metal Oxide Semiconductor Field Effect Transistors).

In such devices, the power semiconductor components arranged on the substrate are often electrically interconnected to form one or more so-called half-bridge circuits, which are used, e.g., for rectifying and inverting electrical voltages and currents.

During the operation of the power semiconductor device, electrical losses occur at the power semiconductor components. These losses heat the power semiconductor components. To cool the power semiconductor components, conventional power semiconductor devices often comprise a heat sink through which a cooling liquid flows and which is thermally conductively coupled to the power semiconductor components.

German Published application DE 10 2010 043 446 B3 discloses providing a heat sink through which a cooling liquid flows. The device includes cutouts arranged in the cooling plate of power semiconductor modules having power semiconductor components. The resultant device provides a good dissipation of heat from the power semiconductor components to the cooling liquid. However, what is disadvantageous in this case is that the cooling plate has to be sealed in relation to the heat sink reliably and over the long term in order to prevent leakage of the cooling liquid over the service life of the power semiconductor device, which is generally envisaged to last for a long time.

SUMMARY OF THE INVENTION

The object of the invention is to provide an improved power semiconductor device which has good heat conduction from the power semiconductor components to a heat sink of the power semiconductor device, through which heat sink a liquid can flow, and in the case of which the heat sink is leaktight reliably and over the long term.

This object is achieved by a power semiconductor device which comprises a power semiconductor module and a heat sink through which a cooling liquid can flow. The power semiconductor module has power semiconductor components arranged on electrically conductive conductor tracks, an electrically non-conductive insulation layer and a cooling plate. The insulation layer is arranged between the conductor tracks and the cooling plate. The heat sink has a first cooling housing component, which has a cutout passing therethrough, and a second cooling housing component connected to the first cooling housing component. The cooling plate is arranged in the cutout. The first and second cooling housing components are configured and arranged relative to one another so that a cavity is formed at the side of the cooling plate which faces away from the power semiconductor components. The cooling plate is connected to the first cooling housing component by a first weld seam which extends circumferentially around the cooling plate. The first weld seam seals the cooling plate in relation to the first cooling housing component.

Furthermore, this object is achieved by use a method for producing a power semiconductor device which comprises the following steps:

a) providing a power semiconductor module having power semiconductor components arranged on electrically conductive conductor tracks, wherein the power semiconductor module has an electrically non-conductive insulation layer and a cooling plate, wherein the insulation layer is arranged between the conductor tracks and the cooling plate, and further providing a first cooling housing component, which has a cutout passing therethrough, and a second cooling housing component connected to the first cooling housing component;

b) arranging the cooling plate in the cutout of the first cooling housing component;

c) welding the cooling plate to the first cooling housing component thereby forming a first weld seam which extends circumferentially around the cooling plate, thereby sealing the cooling plate in relation to the first cooling housing component, wherein the cooling plate is welded to the first cooling housing component at the side of the cooling plate that faces away from the power semiconductor components; and d) arranging the second cooling housing component relative to the first cooling housing component, so that the first and second cooling housing components have such a shape that a cavity is formed at the side of the cooling plate which faces away from the power semiconductor components.

Advantageous embodiments of the method emerge analogously to advantageous embodiments of the power semiconductor device and vice versa.

It proves to be advantageous if the first weld seam connects the lateral side surfaces of the cooling plate to lateral side surfaces of the first cooling housing component that delimit the cutout, thereby ensuring a reliable seal of the heat sink.

It is also advantageous if the first weld seam is arranged on the cavity side. It should be noted that, within the meaning of the invention, a weld seam "arranged on the cavity side" is understood to be a weld seam implemented from the side of the cavity. This provides a significant advantage in that the high heat input required during the welding of the first weld seam is effected at the side of the cooling plate which faces away from the power semiconductor components and, consequently, is not effected on the part of the power semiconductor components, which reliably avoids damage to the sensitive power semiconductor components during the welding of the first weld seam. The cooling plate additionally protects power semiconductor switches and conductor tracks against liquid material that possibly becomes separated during welding. The cooling plate spatially reliably separates the welding process from the power semiconductor components and the conductor tracks.

Furthermore, it proves to be advantageous if the first weld seam is arranged at a first outer side of the heat sink which faces the power semiconductor components. It should be noted that, within the meaning of the invention, a weld seam "arranged at a first outer side of the heat sink facing the power semiconductor components" is understood to be a weld seam implemented from the side of the first outer side of the heat sink which faces the power semiconductor components. A spatial separation of the welding process from the power semiconductor switches and conductor tracks is not provided in this case. In return, the welding of the first weld seam can also still be effected after the second cooling housing component has been connected to the first cooling housing component, which enables a high flexibility in the production of the power semiconductor device.

Furthermore, it proves to be advantageous if a section of the lateral side surfaces of the first cooling housing component that delimit the cutout has a shape corresponding to a section of the lateral side surfaces of the cooling plate. This enables easy and precise arrangement of the cooling plate in the first cooling housing component, which in turn enables precise welding of the cooling plate and to the first cooling housing component.

Furthermore, it proves to be advantageous if the section of the lateral side surfaces of the cooling plate is at an angle of from about 91° to about 115° or of about 89° to about 65° relative to a main surface of the cooling plate facing the power semiconductor components, and the section of the lateral side surfaces of the first cooling housing component that delimit the cutout is at an angle relative to the main surface of the cooling plate facing the power semiconductor components, said angle being approximately equal to the angle of the section of the lateral side surfaces of the cooling plate relative to the main surface of the cooling plate facing the power semiconductor components. This enables easy and very precise arrangement of the cooling plate in the first cooling housing component, which enables very precise welding of the cooling plate and to the first cooling housing component.

Furthermore, it proves to be advantageous if the cooling plate has cooling fins and/or cooling pins which extend into the cavity. This configuration provides a very good transfer of heat from the cooling plate to the liquid flowing through the heat sink.

Furthermore, it proves to be advantageous if the first weld seam is a laser weld seam, an electrode beam weld seam or a friction stir weld seam. A reliable and precise connection of the cooling plate to the first cooling housing component is achieved as a result.

Furthermore, it proves to be advantageous if the second cooling housing component is connected to the first cooling housing component by a second weld seam which extends circumferentially around the second cooling housing component, wherein the second weld seam seals the second cooling housing component in relation to the first cooling housing component. A reliable connection of the second cooling housing component to the first cooling housing component is achieved as a result.

Furthermore, it proves to be advantageous if the first cooling housing component laterally encloses the second cooling housing component, wherein the second weld seam connects the lateral side surfaces of the second cooling housing component to inner lateral side surfaces of the first cooling housing component. A reliable connection of the second cooling housing component to the first cooling housing component is achieved as a result.

Furthermore, it proves to be advantageous if the second weld seam is arranged at a second outer side of the heat sink facing away from the power semiconductor components. It should be noted that, within the meaning of the invention, a weld seam "arranged at a second outer side of the heat sink facing away from the power semiconductor components" is understood to be a weld seam implemented from the side of the second outer side of the heat sink which faces away from the power semiconductor components. Simple welding of the first and second heat sinks externally is made possible as a result.

Furthermore, it proves to be advantageous if the second cooling housing component has a bulge that projects away from the first cooling housing component, wherein the second weld seam connects the lateral side surfaces of the second cooling housing component to a first main surface of the first cooling housing component that faces away from the power semiconductor components. A reliable connection of the second cooling housing component to the first cooling housing component is achieved as a result.

Furthermore, it proves to be advantageous if the second weld seam is a laser weld seam, an electrode beam weld seam or a friction stir weld seam. A reliable and precise connection of the second cooling housing component to the first cooling housing component is achieved as a result.

Furthermore, it proves to be advantageous if that side surface region of the cooling plate which adjoins the first weld seam and that side surface region of the first cooling housing component which adjoins the first weld seam are arranged flush relative to one another. A particularly reliable and precise connection of the cooling plate to the first cooling housing component is achieved as a result. That side surface region of the cooling plate which adjoins the first weld seam and that side surface region of the first cooling housing component which adjoins the first weld seam preferably run parallel to the insulation layer.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
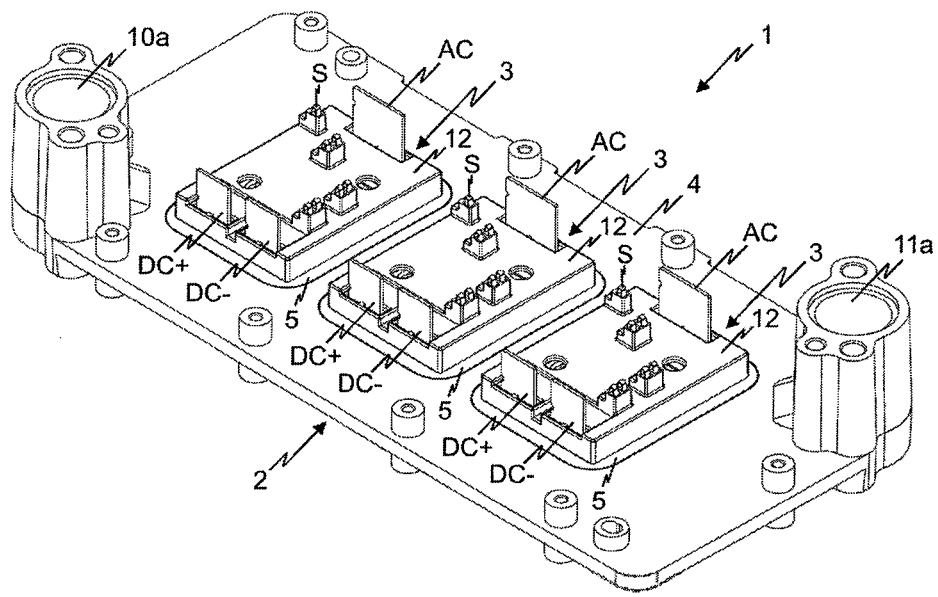
FIG. 1 shows a perspective front view of a power semiconductor device according to the invention.
Figure 2:
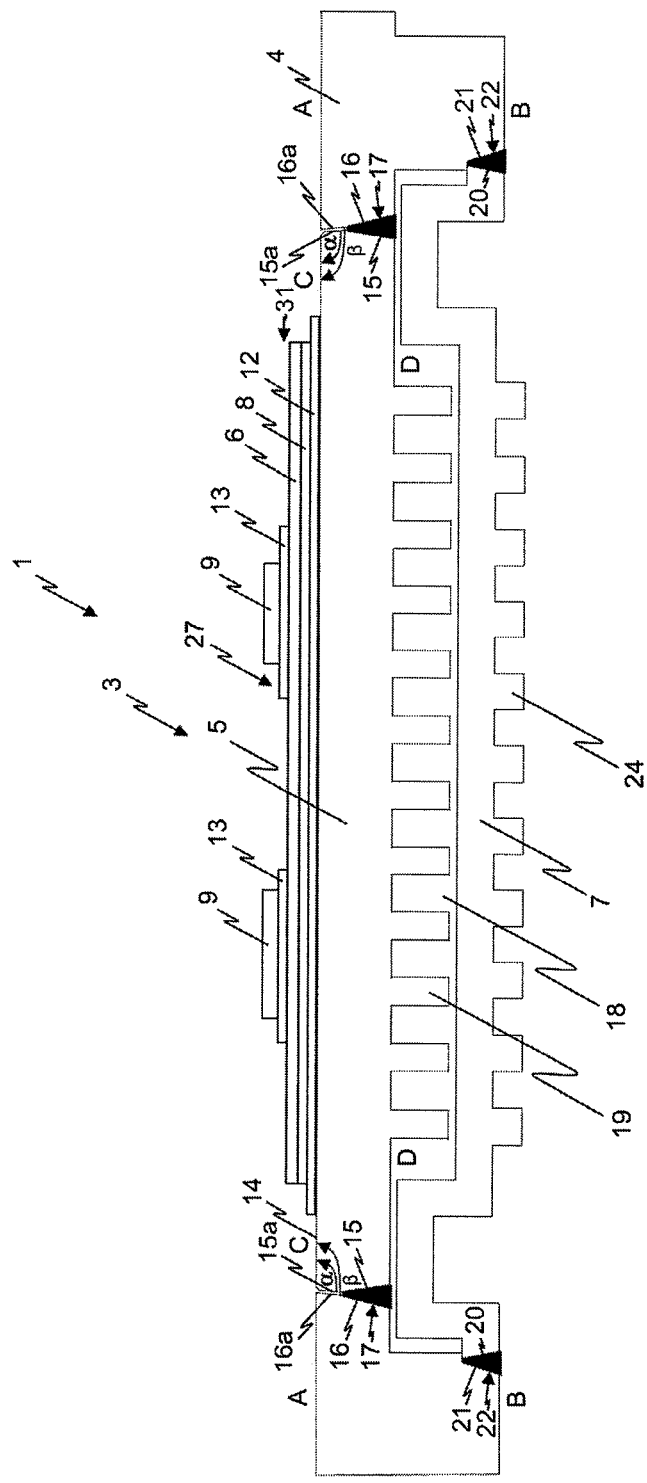
FIG. 2 shows a sectional view of a power semiconductor device according to the invention.
Figure 3:
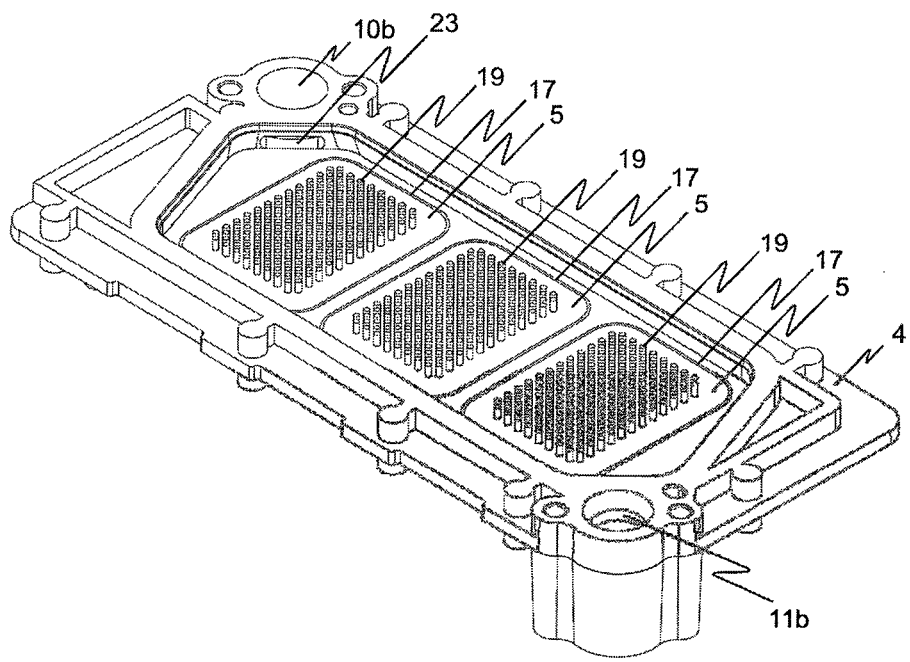
FIG. 3 shows a perspective rear view of a first cooling housing component into which a cooling plate is welded.
Figure 4:
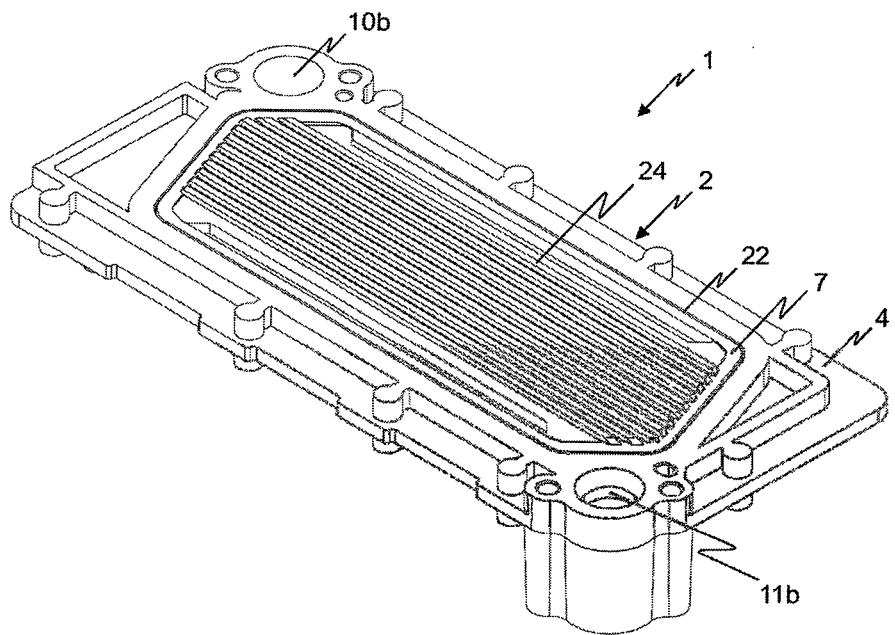
FIG. 4 shows a perspective rear view of a power semiconductor device according to the invention.
Figure 5:
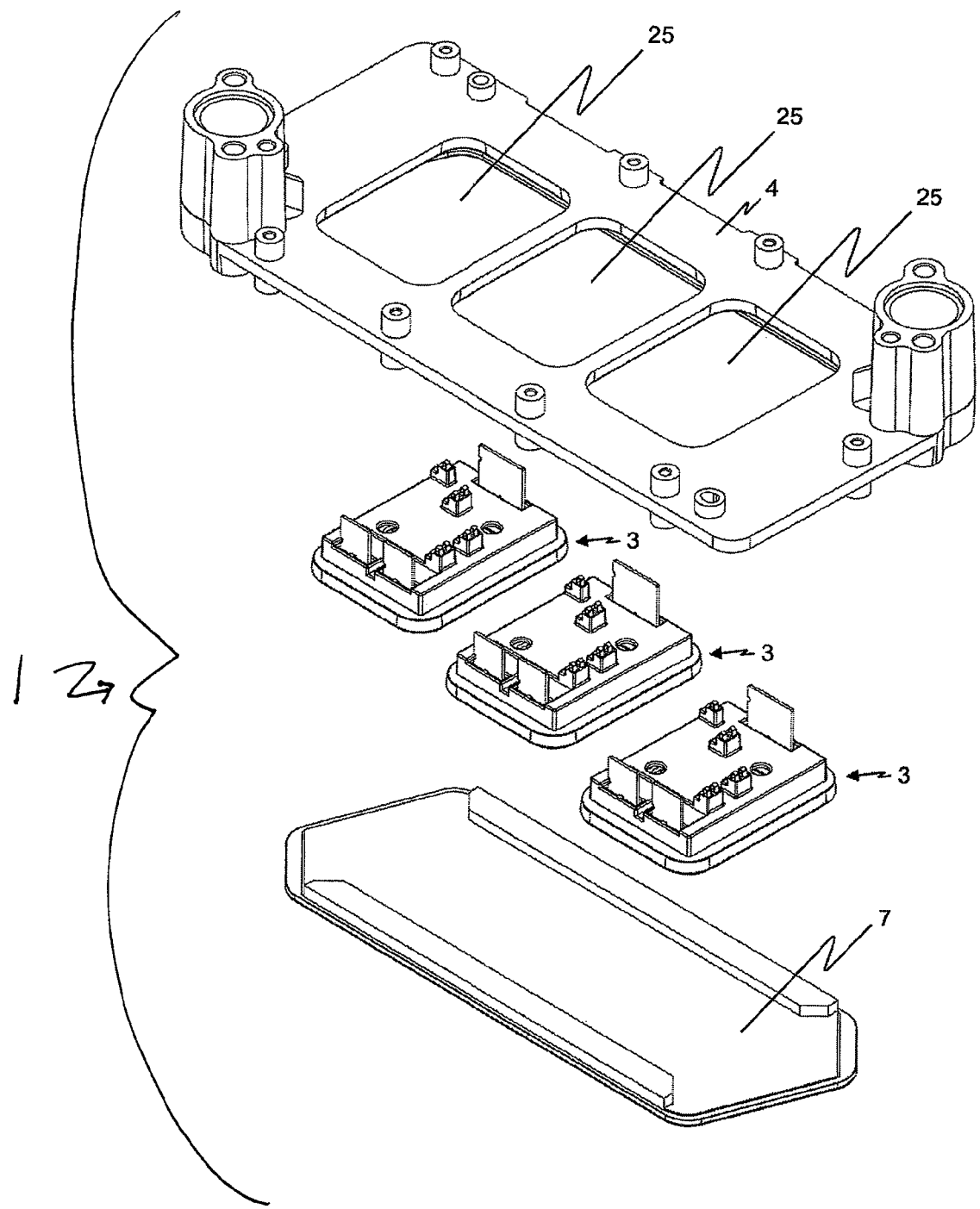
FIG. 5 shows an exploded perspective front view of a power semiconductor device according to the invention in an unassembled state.

FIGS. 1, 2 and 4 show a power semiconductor device 1 according to the invention, FIG. 2 and the other sectional views illustrating only those elements of power semiconductor device 1 which are essential for understanding the invention. FIG. 3 illustrates a perspective rear view of a first cooling housing component 4 into which a cooling plate 5 is welded. FIG. 5 illustrates an exploded perspective front view of power semiconductor device 1 in an unassembled state. Power semiconductor device 1 comprises at least one power semiconductor module 3, wherein power semiconductor device 1 can comprise a plurality of individual power semiconductor modules 3 and comprises three such power semiconductor modules 3 in the exemplary embodiment. Each power semiconductor module 3 has at least one power semiconductor component 9 arranged on electrically conductive conductor tracks 13. Conductor tracks 13 are formed by an electrically conductive structured first conduction layer 31. Power semiconductor components 9 are electrically conductively connected to conductor tracks 13, preferably by a soldering or sintering metal layer. Power semiconductor component 9 is preferably present in the form of a power semiconductor switch or a diode. In this case, the power semiconductor switches are preferably present in the form of transistors, such as, e.g. IGBTs (Insulated Gate Bipolar Transistors) or MOSFETs (Metal Oxide Semiconductor Field Effect Transistors). Each power semiconductor module 3 preferably has a first DC voltage load current terminal element DC+ and a second DC voltage load current terminal element DC− and an AC load terminal element AC, which are electrically conductively connected to first conduction layer 31, preferably by a soldering or sintering metal layer. In the context of the illustrated exemplary embodiment, power semiconductor module 3 generates an AC voltage at the AC voltage load current terminal AC from a DC voltage fed in between the DC voltage load current terminals DC+ and DC−. Furthermore, in the context of the exemplary embodiment, power semiconductor module 3 has control terminal elements S, which are electrically conductively connected to the control terminals of the power semiconductor switches of power semiconductor module 3.

Furthermore, power semiconductor module 3 has an electrically non-conductive insulation layer 6 and a cooling plate 5, wherein insulation layer 6 is arranged between conductor tracks 13 and cooling plate 5. Conductor tracks 13 are connected to insulation layer 6. In the context of the exemplary embodiment, an electrically conductive, preferably unstructured second conduction layer 8 is arranged between insulation layer 6 and cooling plate 5, and is connected to insulation layer 6. The insulation layer 6 is preferably formed as a ceramic body. First and second conduction layers 31 and 8 and insulation layer 6 are formed together preferably by a direct copper bonded substrate (DCB substrate).

It should be noted at this juncture that first and second conduction layers 31 and 8 can consist of an individual layer or else a plurality of layers lying one above another. In this regard, first and/or second conduction layer(s) 31 and 8 can comprise, e.g., a copper layer having an individual coating or a plurality of coatings lying one above another, e.g., composed of a noble metal (e.g., silver) or composed of a noble metal compound, which can serve, e.g., as adhesion promoting layers and/or protective layers.

Cooling plate 5 is preferably formed of aluminum (e.g., Al 99.5) and, at its side C facing power semiconductor components 9, can be coated with an individual layer or a plurality of layers lying one above another, which, e.g., respectively can serve as an adhesion promoting layer and/or as a protective layer and/or can serve to reduce mechanical stresses between insulation layer 6 and cooling plate 5 which can occur in the event of temperature changes, on account of different coefficients of thermal expansion of insulation layer 6 and cooling plate 5. In the context of the exemplary embodiment, cooling plate 5 is coated with a copper layer 12 at its side C facing insulation layer 6, which copper layer 12 can in turn be coated, e.g., with a coating, in particular a noble metal coating (e.g., silver). Copper layer 12 is arranged between cooling plate 5 and insulation layer 6, and, more specifically, between cooling plate 5 and second conduction layer 8. Second conduction layer 8 is connected to cooling plate 5, preferably by a soldering or sintering metal layer, directly or indirectly (if the cooling plate, at its side facing the power semiconductor components, is coated with an individual layer or a plurality of layers lying one above another). In the context of the exemplary embodiment, second conduction layer 8 is connected to copper layer 12 by a soldering or sintering metal layer.

For the sake of clarity, the soldering or sintering metal layers are not illustrated in FIG. 2. Furthermore, it should be noted that the thickness of the layers and the thickness of the power semiconductor components are not illustrated in a manner true to scale.

It should be noted at this juncture that cooling plate 5 can also be present in the form of an aluminum body of an insulated metal substrate (IMS).

Cooling plate 5 preferably has cooling fins and/or cooling pins 19 at its side D facing away from power semiconductor components 9.

Furthermore, power semiconductor device 1 comprises a heat sink 2 through which a liquid can flow and which has a first cooling housing component 4 and a second cooling housing component 7. First cooling housing component 4 has, for the respective power semiconductor modules 3, a respective cutout 25 which passing through first cooling housing component 4 (see FIG. 5), cooling plate 5 of the respective power semiconductor module 3 being arranged in the respective cutout 25. In this case, a part of the respective cooling plate 25 can project from the respective cutout 25. The respective cooling plate 5 closes the respective cutout 25. First and second cooling housing components 4 and 7 have such a shape and are arranged relative to one another in such a way that a cavity 18 is formed at the side D of cooling plate 5 which faces away from power semiconductor components 9. Second cooling housing component 7 is connected to first cooling housing component 4. The liquid flows through heat sink 2 by virtue of said liquid flowing through cavity 18. The heat of cooling plate 5 is transferred to the liquid and is transported away by the liquid.

The arrangement of power semiconductor modules 3 and the connection of power semiconductor modules 3 to first cooling housing component 4 are described below on the basis of one of the power semiconductor modules 3, the other power semiconductor modules 3 being arranged and connected to the first cooling housing component 4 in an analogous way.

Cooling plate 5 of power semiconductor module 3 is connected to first cooling housing component 4 by a first weld seam 17 which extends circumferentially around cooling plate 5, wherein first weld seam 17 seals cooling plate 5 in relation to first cooling housing component 4. First weld seam 17 runs in a circumferentially closed manner around cooling plate 5.

In this case, first weld seam 17 preferably connects lateral side surfaces 15 of cooling plate 5 to lateral side surfaces 16 of first cooling housing component 4 that delimit cutout 25.

First weld seam 17 is preferably arranged exclusively on the cavity side, i.e., exclusively on the side of cavity 18. First weld seam 17 is preferably arranged exclusively at side D of cooling plate 5 which faces away from power semiconductor components 9. In this way, first weld seam 17 does not run through completely from the side of cavity 18 to the first outer side A of heat sink 2 which faces power semiconductor components 9. This has the major advantage that the high heat input required during the welding of first weld seam 17 is effected at the side D of cooling plate 5 which faces away from power semiconductor components 9 and, consequently, is not effected on the part of power semiconductor components 9, which reliably avoids damage to the sensitive power semiconductor components 9 during the welding of first weld seam 17. Cooling plate 5 additionally protects power semiconductor switches 9 and conductor tracks 13 against liquid material that possibly becomes separated during welding. Cooling plate 5 thus spatially reliably separates the welding process from power semiconductor components 9 and conductor tracks 13. Furthermore, an arrangement of first weld seam 17 on the cavity side ensures that no gap exists between cooling plate 5 and first cooling housing component 4 into which liquid can penetrate from cavity 18, which, since such liquid would remain at rest in the gap, can lead to a corrosion of cooling plate 5 or of first cooling housing component 4.

Figure 6:
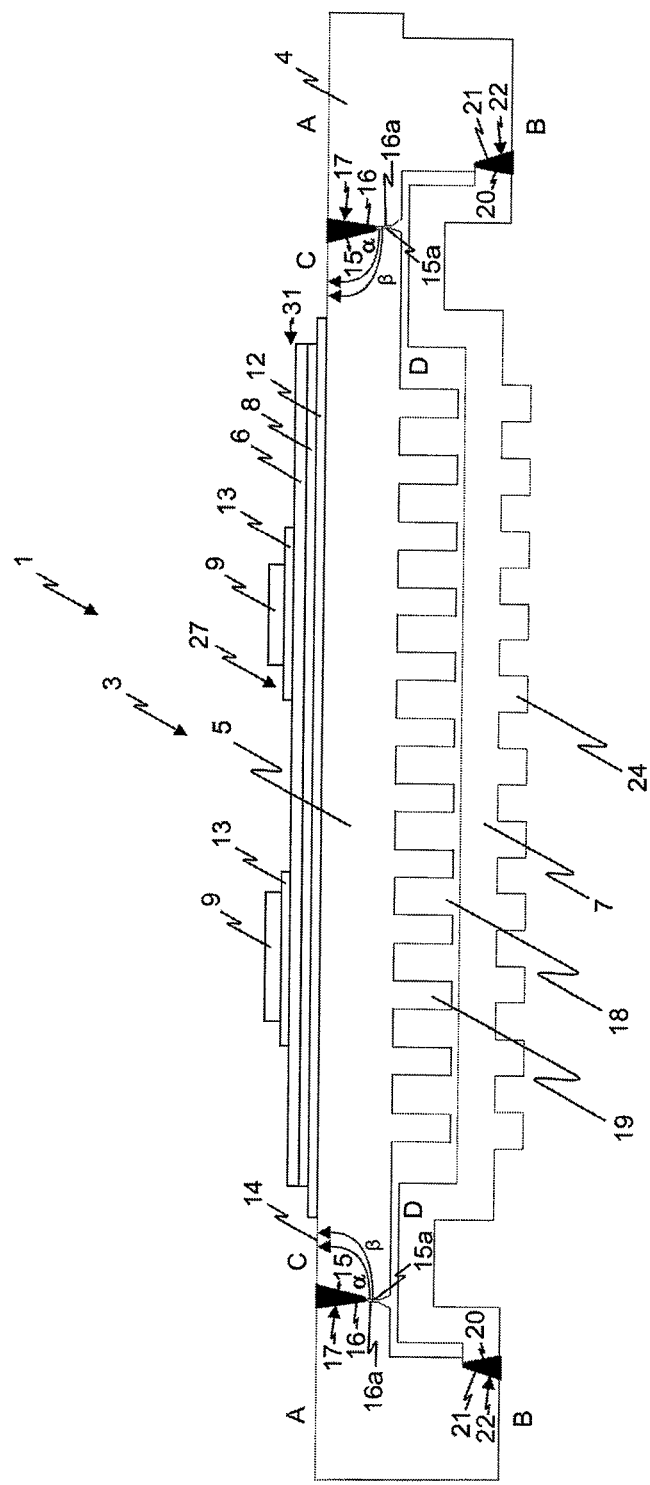
FIG. 6 shows a sectional view of a secondary embodiment of a power semiconductor device according to the invention.

As an alternative thereto, as illustrated in FIG. 6, first weld seam 17 can also be arranged exclusively at a first outer side A of heat sink 2 facing power semiconductor components 9. In this case, first weld seam 17 is arranged exclusively at the side C of cooling plate 5 which faces power semiconductor components 9. In this way, first weld seam 17 does not run through completely from first outer side A of heat sink 2 facing power semiconductor components 9 to the side of cavity 18. A spatial separation of the welding process from power semiconductor switches 9 and conductor tracks 13 is not provided in this case. In return, the welding of first weld seam 17 can also still be effected after second cooling housing component 7 has been connected to first cooling housing component 4, which enables a high flexibility in the production of power semiconductor device 1.

Preferably, a section 16a of lateral side surfaces 16 of first cooling housing component 4 that delimits cutout 25 has a shape that corresponds to the shape of a section 15a of lateral side surfaces 15 of cooling plate 5. For this purpose, preferably section 15a of lateral side surfaces 15 of cooling plate 5 is at an angle α in a range between about 91° to about 115° or about 89° to about 65° relative to a main surface 14 of cooling plate 5 which faces power semiconductor components 9, and section 16a of lateral side surfaces 16 of first cooling housing component 4 that delimit cutout 25 is at an angle β relative to main surface 14 of cooling plate 5 facing power semiconductor components 9, said angle β being approximately equal to angle α of section 15a of lateral side surfaces 15 of cooling plate 5 relative to main surface 14 of cooling plate 5 facing power semiconductor components 9. A gap is preferably formed between section 15a of lateral side surfaces 15 of cooling plate 5 and section 16a of lateral side surfaces 16 of first cooling housing component 4 that delimit cutout 25.

As an alternative thereto, e.g., a section of the lateral side surfaces of the cooling plate can also have a first stepped shape and a section of the lateral side surfaces of the first cooling housing component that delimit the cutout can have a second stepped shape, corresponding to the first stepped shape.

The welding of first weld seam 17 is preferably effected by a laser, such that first weld seam 17 is preferably embodied as a laser weld seam. Alternatively, the welding of first weld seam 17 can, e.g., also be effected by electrode beam welding, such that first weld seam 17 can be embodied as an electrode beam weld seam. As a still further alternative, the welding of the first weld seam 17 can be effected by friction stir welding, such that first weld seam 17 can be embodied as a friction stir weld seam. It goes without saying that other welding methods are also possible for forming first weld seam 17.

Cooling plate 5 preferably has cooling fins and/or cooling pins 19 which extend into cavity 18.

Preferably, second cooling housing component 7 is connected to first cooling housing component 4 by a second weld seam 22 which extend generally circumferentially around second cooling housing component 7, wherein second weld seam 22 seals second cooling housing component 7 in relation to first cooling housing component 5. Second weld seam 22 runs in a circumferentially closed manner around second cooling housing component 7.

In the context of the exemplary embodiment in accordance with FIGS. 1 to 6, first cooling housing component 4 laterally encloses second cooling housing component 7, wherein second weld seam 22 connects lateral side surfaces 20 of second cooling housing component 7 to inner lateral side surfaces 21 of first cooling housing component 4. First cooling housing component 4 forms the lateral outer walls of heat sink 2. Second weld seam 22 is arranged at a second outer side B of heat sink 2 facing away from power semiconductor components 9. In this way, second weld seam 22 is arranged at the second outer side B of heat sink 2 opposite first outer side A of heat sink 2 facing power semiconductor components 9.

The welding of second weld seam 22 is preferably effected by a laser, such that second weld seam 22 is preferably embodied as a laser weld seam. Alternatively, the welding of second weld seam 22 can, e.g., also be effected by electrode beam welding, such that second weld seam 22 can be embodied as an electrode beam weld seam. As a further alternative, the welding of second weld seam 22 can also be effected by friction stir welding, such that second weld seam 22 can be embodied as a friction stir weld seam. It goes without saying that other welding methods are also possible for forming the second weld seam.

Second cooling housing component 7 preferably has cooling fins and/or cooling pins 24 at its side which faces away from power semiconductor components 9.

Heat sink 2 furthermore preferably has a liquid forward-run inlet opening 10a and a liquid forward-run outlet opening 10b aligned with liquid forward-run inlet opening 10a, and a liquid return-run inlet opening 11a and a liquid return-run outlet opening 11b aligned with liquid return-run inlet opening 11a. During the operation of power semiconductor device 1, the liquid (e.g., water) used to cool power semiconductor components 9 flows into liquid forward-run inlet opening 10a of heat sink 2. One part of the liquid flows out of heat sink 2 again through liquid forward-run outlet opening 10b and another part flows through heat sink 2 and in particular through cavity 18 and flows out of heat sink 2 again at liquid return-run outlet opening 11b. The liquid flows into and out of cavity 18 via channels, only one channel 23 being visible in FIG. 3. The arrangement of liquid forward-run inlet opening 10a, liquid forward-run outlet opening 10b, liquid return-run inlet opening 11a and liquid return-run outlet opening 11b allows a plurality of heat sinks 2 and a plurality of power semiconductor devices 1 according to the invention to be arranged one after another to form a power semiconductor device system, the respectively associated liquid openings of the heat sinks being connected to one another.

Figure 7:
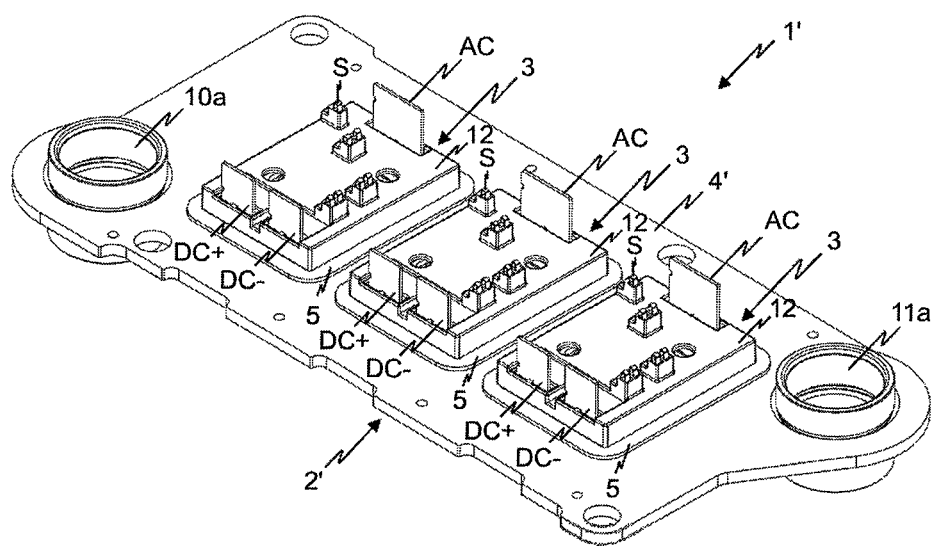
FIG. 7 shows a perspective front view of a further power semiconductor device according to the invention.
Figure 8:
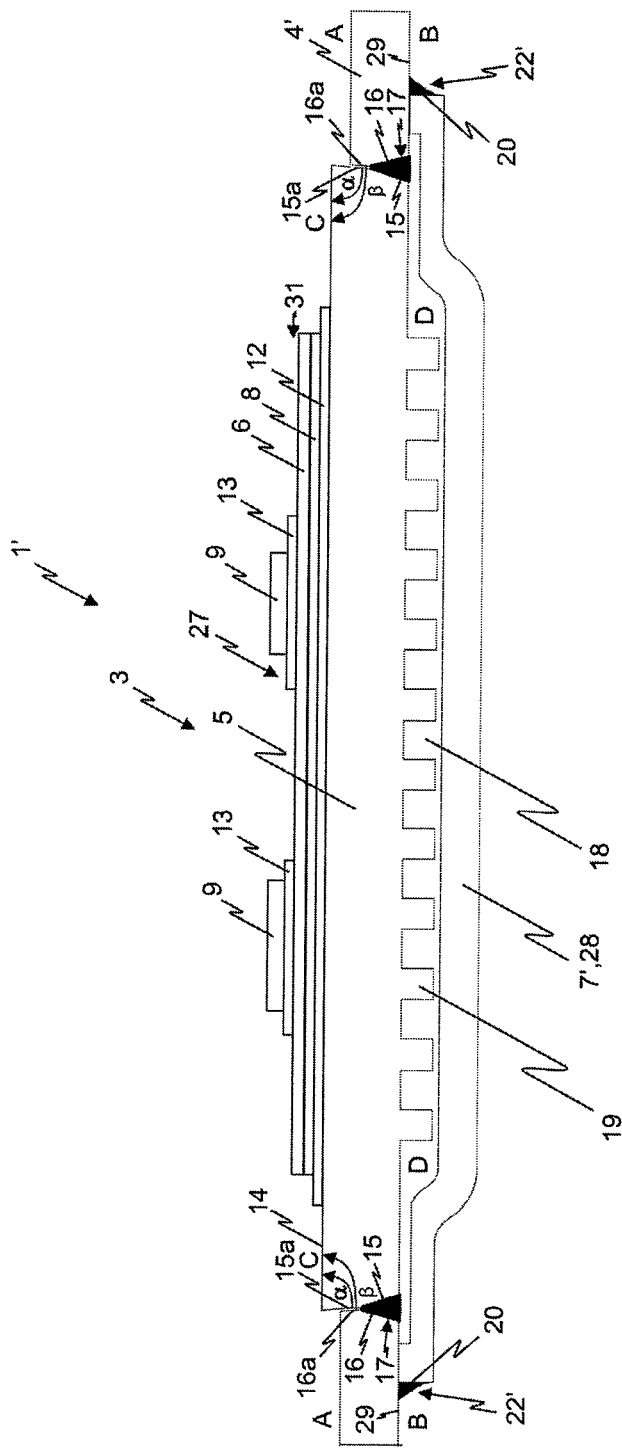
FIG. 8 shows a sectional view of a further power semiconductor device according to the invention.
Figure 9:
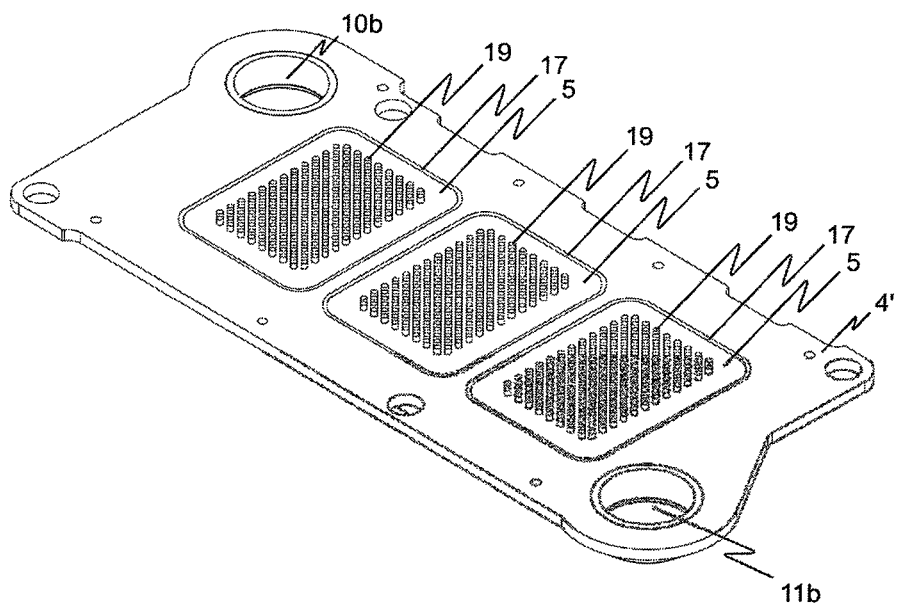
FIG. 9 shows a perspective rear view of a first cooling housing component into which a cooling plate is welded.
Figure 10:
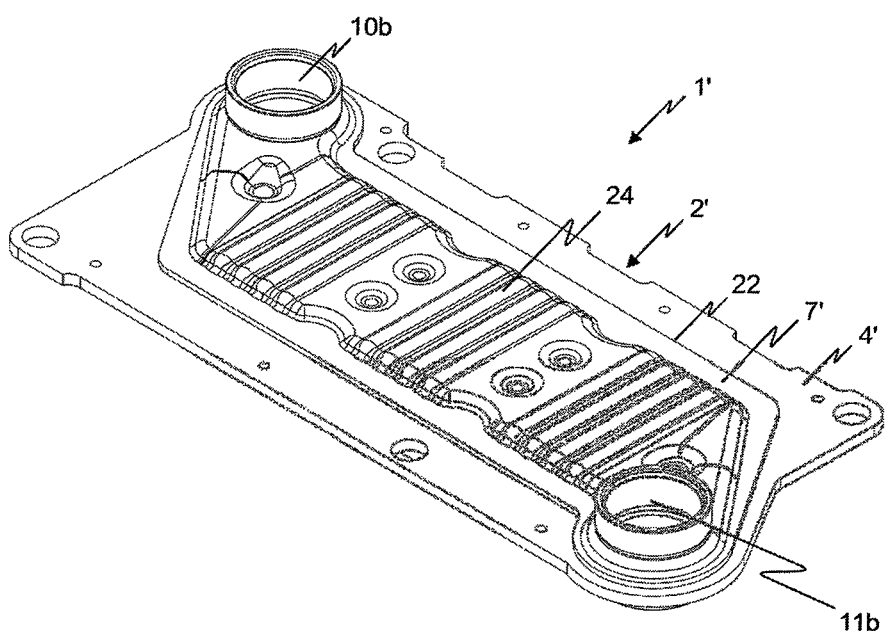
FIG. 10 shows a perspective rear view of a further power semiconductor device according to the invention.
Figure 11:
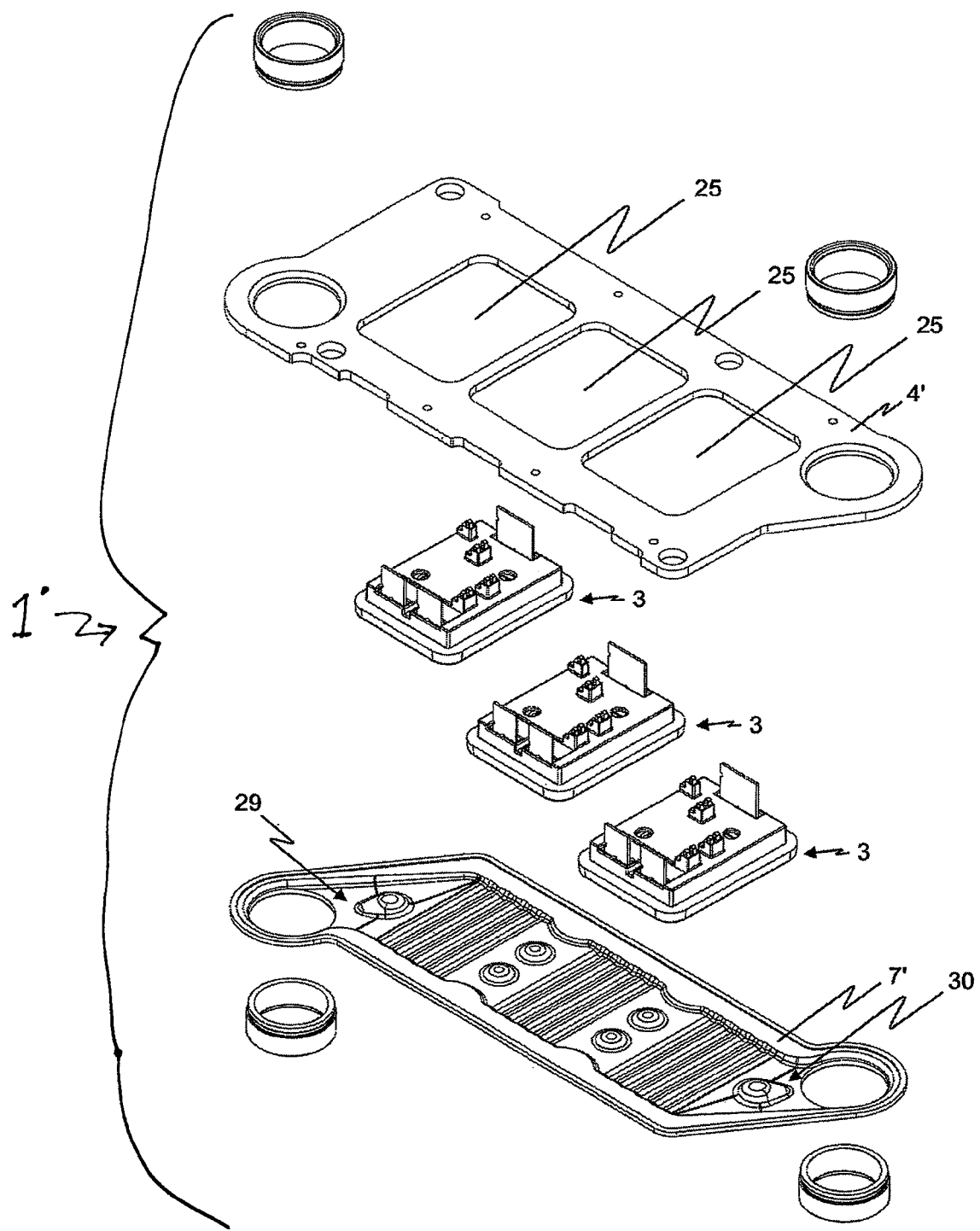
FIG. 11 shows an exploded perspective front view of a further power semiconductor device according to the invention in an unassembled state.

FIGS. 7, 8 and 10 illustrate a further power semiconductor device 1' according to the invention, with only the elements of the power semiconductor device 1' that are essential for understanding the invention being illustrated in FIG. 8. FIG. 9 illustrates a perspective rear view of a first cooling housing component 4' into which a cooling plate 5 is welded. FIG. 11 illustrates the power semiconductor device 1' in an unassembled state. In this case, power semiconductor device 1' is constructed analogously to power semiconductor device 1, wherein first and second cooling housing components 4' and 7' are embodied in a modified fashion relative to first and second cooling housing components 4 and 7 of power semiconductor device 1. In this case, identical elements in FIGS. 7 to 11 are provided with the same reference signs as in FIG. 1 to FIG. 6. In the case of power semiconductor device 1', second cooling housing component 7' has a bulge 28 projecting away from first cooling housing component 4', wherein second weld seam 22' connects lateral side surfaces 20 of second cooling component 7' to a first main surface 29 of first cooling component 4' facing away from power semiconductor components 9. First cooling housing component 4' does not laterally enclose second cooling housing component 7'. Second cooling housing component 7' is arranged alongside first cooling housing component 4' in a direction away from power semiconductor components 9.

It should be noted at this juncture that the first cooling housing component preferably consists of aluminum (e.g. AL 99.5) or an aluminum alloy, such as, e.g., AlSi10Mg—F or AlMg4.5Mn. Furthermore, it should be noted that the second cooling housing component preferably consists of aluminum (e.g. AL 99.5) or an aluminum alloy, such as, e.g., AlSi10Mg—F or AlMg4.5Mn. Preferably, the aluminum or the aluminum alloy should have few pores or be free of pores at least in the region of the respective weld seam. The first and/or second cooling housing components can be present respectively, e.g., in the form of a cast component or in the form of a deep-drawn component.

One of ordinary skill in the art will recognize that the first and second cooling housing components can respectively be embodied integrally or can respectively be embodied from parts connected to one another.

Preferably that side surface region of the cooling plate which adjoins the first weld seam and that side surface region of the first cooling housing component which adjoins the first weld seam are arranged flush with one another. That side surface region of the cooling plate which adjoins the first weld seam and that side surface region of the first cooling housing component which adjoins the first weld seam preferably run parallel to the insulation layer.

A method for producing a power semiconductor device 1 or 1' according to the invention is specified below.

A first method step involves providing a power semiconductor module 3 having power semiconductor components 9 arranged on electrically conductive conductor tracks 13, wherein power semiconductor module 3 has an electrically non-conductive insulation layer 6 and a cooling plate 5, wherein insulation layer 9 is arranged between the conductor tracks 13 and the cooling plate 5, and providing a first cooling housing component 4 or 4', which has a cutout 25 passing through the first cooling housing component 4 or 4', and providing a second cooling housing component 7 or 7'.

A further method step involves arranging cooling plate 5 in cutout 25.

A further method step involves welding the cooling plate 5 to first cooling housing component 4 or 4' to form a first weld seam 17 which extends circumferentially around cooling plate 5, thereby sealing cooling plate 5 in relation to first cooling housing component 4 or 4', wherein cooling plate 5 is welded to first cooling housing component 4 or 4' at the side D of cooling plate 5 which faces away from power semiconductor components 9.

A further method step involves arranging and forming second cooling housing component 7 or 7' relative to first cooling housing component 4 or 4', to form a cavity 18 at the side D of cooling plate 5 which faces away from power semiconductor components 9.

A further method step involves connecting second cooling housing component 7 or 7' to first cooling housing component 4 or 4'. Preferably, connecting second cooling housing component 7 or 7' to first cooling housing component 4 or 4' is effected by welding second cooling housing component 7 or 7' to first cooling housing component 4 or 4', so that second cooling housing component 7 or 7' is connected to first cooling housing component 4 or 4' by a second weld seam 22 or 22' which extends circumferentially around second cooling housing component 7 or 7', wherein second weld seam 22 or 22' seals second cooling housing component 7 or 7' in relation to first cooling housing component 4 or 4'.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor device comprising:
   a power semiconductor module having
      electrically conductive conductor tracks,
      a cooling plate having
         a first cooling housing component with a cutout passing therethrough, and
         a second cooling housing component connected to said first cooling housing component, and
      an electrically non-conductive insulation layer disposed between said conductor tracks and said cooling plate;
   a heat sink through which a liquid can flow; and
   at least one at least one power semiconductor component arranged on said electrically conductive conductor tracks of said power semiconductor module, wherein said cooling plate is arranged in said cutout;
wherein said first and second cooling housing components are configured and arranged relative to one another so that a cavity is formed at said side of said cooling plate which faces away from said at least one at least one power semiconductor component;
wherein said cooling plate is connected to said first cooling housing component by a first weld seam which extends circumferentially around said cooling plate; and
wherein said first weld seam seals said cooling plate relative to said first cooling housing component.

2. The power semiconductor device of claim 1, wherein said cooling plate includes a lateral side surface and said first weld seam connects said lateral side surface of said cooling plate to a lateral side surface of said first cooling housing component that delimits said cutout.

3. The power semiconductor device of claim 1, wherein said first weld seam is arranged on said cavity side of said cooling plate.

4. The power semiconductor device of claim 1, wherein said first weld seam is arranged at a first outer side of said heat sink which faces said at least one power semiconductor components.

5. The power semiconductor device of claim 2, wherein a section of said lateral side surface of said first cooling housing component that delimits said cutout has a shape that corresponds to the shape of a section of said lateral side surface of said cooling plate.

6. The power semiconductor device of claim 5, wherein said section of said lateral side surface of said cooling plate is at a first angle relative to a main surface of said cooling plate facing said at least one at least one power semiconductor component, said first angle falling in a range of from about 91° to about 115° or from about 89° to about 65°, and said section of said lateral side surface of said first cooling housing component that delimits said cutout is at a second angle relative to said main surface of said cooling plate facing said at least one at least one power semiconductor component, said second angle being approximately equal to said first angle.

7. The power semiconductor device of claim 1, wherein said cooling plate has at least one of cooling fins and cooling pins extending into said cavity.

8. The power semiconductor device of claim 1, wherein said first weld seam is embodied as one of a laser weld seam, an electrode beam weld seam and a friction stir weld seam.

9. The power semiconductor device of claim 1,
wherein said second cooling housing component is connected to said first cooling housing component by a second weld seam which extends circumferentially around said second cooling housing component; and
wherein said second weld seam seals said second cooling housing component in relation to said first cooling housing component.

10. The power semiconductor device of claim 9
wherein said first cooling housing component laterally encloses said second cooling housing component; and
wherein said second weld seam connects said lateral side surface of said second cooling housing component to an inner lateral side surface of said first cooling housing component.

11. The power semiconductor device of claim 10, wherein said second weld seam is arranged at a second outer side of said heat sink which faces away from said at least one power semiconductor component.

12. The power semiconductor device of claim 9
wherein said second cooling housing component has a bulge which projects away from said first cooling housing component; and
wherein said second weld seam connects said lateral side surface of said second cooling housing component to a first main surface of said first cooling housing component which faces away from said at least one power semiconductor component.

13. The power semiconductor device of claim 9, wherein said second weld seam is embodied as one of a laser weld seam, an electrode beam weld seam and a friction stir weld seam.

14. A method for producing a power semiconductor device comprising the steps of:
a) providing a power semiconductor module having electrically conductive conductor tracks,
a cooling plate having
a first cooling housing component with a cutout passing therethrough, and
a second cooling housing component, and
an electrically non-conductive insulation layer disposed between said conductor tracks and said cooling plate; and
at least one at least one power semiconductor component arranged on said electrically conductive conductor tracks of said power semiconductor module,
b) arranging said cooling plate in said cutout;
c) welding said cooling plate to said first cooling housing component thereby forming a first weld seam which extends circumferentially around said cooling plate, said first weld seam sealing said cooling plate in relation to said first cooling housing component, wherein said cooling plate is welded to said first cooling housing component at said side of said cooling plate which faces away from said at least one power semiconductor component;
d) forming a cavity between said first and second cooling housing components by arranging and shaping said second cooling housing component relative to said first cooling housing, said cavity being formed at that side of said cooling plate which faces away from said at least one power semiconductor components; and
e) connecting said second cooling housing component to said first cooling housing component.

15. The method of claim 14, wherein the step of connecting said second cooling housing component to said first cooling housing component is effected by welding said second cooling housing component to said first cooling housing component, thereby forming a second weld seam which extends circumferentially around said second cooling housing component, said second weld seam sealing said second cooling housing component in relation to said first cooling housing component.

* * * * *